United States Patent [19]

Rueb

[11] 4,062,469
[45] Dec. 13, 1977

[54] ELECTRONIC INSTRUMENT CASE

[75] Inventor: Gunter Rueb, Laguna Niguel, Calif.

[73] Assignee: American Zettler, Inc., Irvine, Calif.

[21] Appl. No.: 754,440

[22] Filed: Dec. 27, 1976

[51] Int. Cl.² ............................................. B65D 41/32
[52] U.S. Cl. .................................... 220/268; 220/367;
220/DIG. 27; 174/17 VA
[58] Field of Search ............. 220/268, 266, 367, 85 V,
220/85 TC, DIG. 27; 174/17 VA; 317/230

[56] References Cited
U.S. PATENT DOCUMENTS
3,219,488 11/1965 Southworth, Jr. .............. 220/367 X Primary Examiner—George T. Hall
Attorney, Agent, or Firm—Harvey C. Nienow

[57] ABSTRACT

An electronic instrument case formed of breakable plastic and having a section of reduced thickness which is firmly secured to the remainder of the wall of such enclosure by a retainer. Such reduced thickness section can be broken away from the remainder of the wall of the enclosure but it is held in attached relation thereto to thereby provide a "breathing" opening for such enclosure.

5 Claims, 7 Drawing Figures

ELECTRONIC INSTRUMENT CASE

The present invention relates generally to electronic instrument cases, but more particularly to such cases which are enabled to "breathe" during changes in ambient pressure.

The electronic industries have grown appreciably during the past three or four decades, to a point where, today, many different electronic devices are mass-produced, and are consumed by millions of individuals. The advent of printed circuit boards has been a strong impetus in the mass-producing of electronic devices because such boards can be manufactured quickly and accurately, and electronic components can be added thereto by dip or wave soldering, or the like.

Typically, electronic components are fastened to a printed circuit board by insertion of terminals on the component into appropriate openings in the board. Thereafter, by such a mass-production soldering process, the terminals of the component can be quickly and effectively soldered to the board.

Many such components, for effective operation and long life, must be sealed or protected within a case or enclosure to prevent the ingress of foreign, deleterious materials. Certain of such components, on the other hand, perform more effectively under ambient conditions as, for instance, at whatever temperature or pressure prevails externally of the component. That is, relays for instance perform more effectively if pressure variations outside the relay case are permitted to cause corresponding pressure variations within the case, otherwise upon the breakdown of the hermetic seal deleterious foreign materials are permitted to enter the case. Thus, at least with respect to electronic relays, it has been discovered that it is most beneficial to have the relay case "breathe" to enable the pressure within the case to be, at all times, comparable to the ambient pressure external thereof.

The aforedescribed soldering process for attaching electronic components to printed circuit boards prevents the utilization of relay cases which are formed with breathing holes or the like to permit air or pressure variations to pass into and out of such case. That is, in the dip or wave soldering processes, considerable solder, but most importantly considerable soldering flux, is caused to contact the board and all of the various components. Any case which is formed with a breathing hole or opening runs the severe risk of having some of the solder and/or flux enter the working parts of the component and causing operational difficulties. This is particularly noticeable with respect to relays which have electrical contacts formed of special alloys and which operate effectively only if they are clean and devoid of foreign material.

It is an object of the present invention to provide an electronic instrument case which can remain hermetrically sealed during the various assembly processes but which can thereafter be transformed into a case which "breathes".

Another object of the present invention is to provide an electronic instrument case as characterized above which can be converted from such hermetically sealed condition through simple and inexpensive procedures.

An even further object of the present invention is to provide an electronic instrument case as characterized above which is so constructed that unskilled labor utilizing very commonplace tools can convert the case to its "breathing" condition.

A still further object of the present invention is to provide an electronic instrument case as characterized above which comprises a section of reduced thickness which can be broken away from the remainder of the case with substantially any kind of pointed instrument.

An even further object of the present invention is to provide an electronic instrument case as characterized above which includes a retaining member such that once the reduced thickness section is broken away, it is retained connected to the remainder of the case so as to prevent any faulty operation of the instrument as a result of such broken away section interferring with moving parts or the like.

A still further object of the present invention is to provide an electronic instrument case as characterized above which is simple and inexpensive to manufacture, and which is rugged and dependable in operation.

The novel features which I consider characteristic of my invention are set forth with particularity in the appended claims. The invention itself, however, both as to its organization and mode of operation, together with additional objects and advantages thereof, will best be understood from the following description of specific embodiments when read in connection with the accompanying drawings, in which:

Like reference characters indicate corresponding parts throughout the several views of the drawings.

Figure 1:
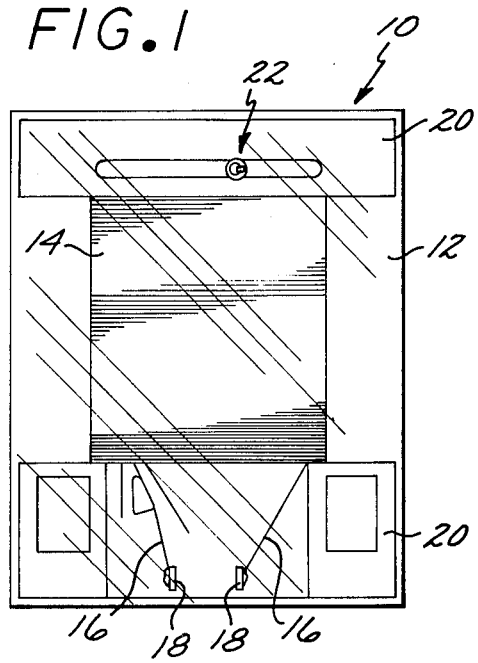
FIG. 1 is a top plan view of a relay having a transparent plastic case or enclosure.

Referring to FIG. 1 of the drawings, there is shown therein an electronic component or instrument 10 having an outer case or enclosure 12 which, in this instance, is transparent. Such transparent case exposes an electromagnetic winding 14, lead wires 16 connected to a pair of terminals 18 and suitable plastic mounting structure, as shown at 20, for retaining the instrument in assembled relation. The device shown in the case 12 of FIG. 1 is a relay, but is well realized that the subject invention could be equally applied to an enclosure or case for substantially any other type of electronic instrument or component.

Not shown in FIG. 1 are the terminals which extend from case 12 and which enable the relay to be suitably fastened to printed circuit boards as above described.

The entire plastic case 12 is typically hermetically sealed, therebeing two portions or halves to the case which are brought together to enclose the relay, and thereafter the adjacent surfaces are suitably welded together by appropriate bonding materials or procedures.

Located in the case 12 is a pressure equalizing device 22. As will hereinafter become more apparent to those persons skilled in the art, such pressure equalizing means should be placed in the vacinity of non-moving relay parts, in this case such means being placed adjacent the plastic mounting structure 20.

Figure 3:
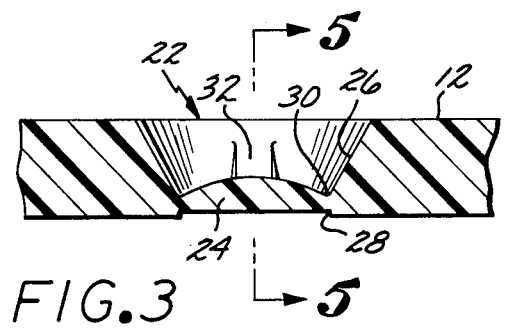
FIG. 3 is a fragmentary sectional view taken substantially along line 3—3 of FIG. 2.

Referring to FIG. 3 of the drawings, the pressure equalizing means 22 comprises a section of reduced thickness 24 formed in the side wall of the case 12. Such reduced section is provided by means of the frusto-conically shaped chamfer 26 which extends from maximum diameter at the external surface of the wall of the case 12, to a minimum diameter at the reduced section 24.

As also shown most particularly in FIG. 3, the interior surface of case 12 at the reduced section 24 is formed with an offset or angle as shown at 28, such angle being generally aligned with the angle 30 formed by the chamfer 26 meeting the reduced section 24. Such alignment provides a weakness about the section 24 for purposes which will hereinafter be explained in greater detail.

Figure 2:
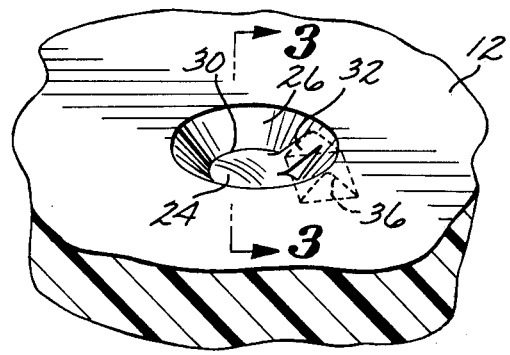
FIG. 2 is a fragmentary sectional view of a portion of the case of FIG. 1.
Figure 5:
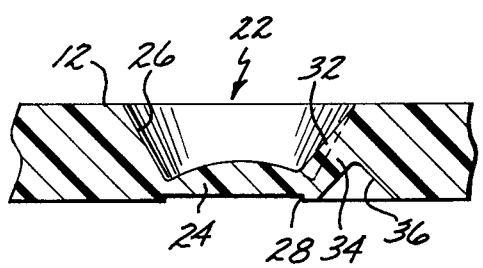
FIG. 5 is a fragmentary sectional view taken substantially along line 5—5 of FIG. 3.

Attached to section 24 or formed integrally therewith is a retaining member 32 which extends from a point on the chamfer 26 to the reduced section 24. Such retainer is tapered, as shown most particularly in FIGS. 2, 5 and 6 of the drawings, to provide varying strength and flexibility therealong.

To provide a controlled hinge section 34 on the retaining member 32, an arcuately shaped cutout 36 is provided in the wall of case 12. Such cutout 36 extends for a distance greater than the width of retaining member 32 to thereby establish the hinge portion 34 for the entire width of such retaining member.

Such retaining member, because of its greater thickness at the chamfer 26, will not break away from the remainder of the wall of case 12 as readily as will the reduced section 24, as will hereinafter be explained in greater detail. Also, the controlled hinge portion 34 is of sufficient thickness to not permit the reduced section to become loose from case 12.

With the reduced section 24 in its position shown in FIG. 3, the case 12 remains hermetically sealed, provided the proper sealing procedures have been followed. This is the condition of the case when the device 10 is being soldered to a printed circuit board, at which time deleterious materials such as soldering flux is present.

Figure 7:
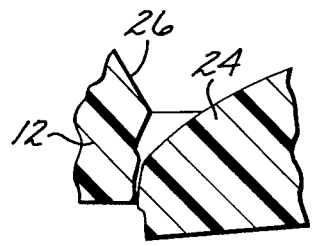
FIG. 7 is a fragmentary sectional view of a portion of FIG. 6 of the drawings.
Figure 4:
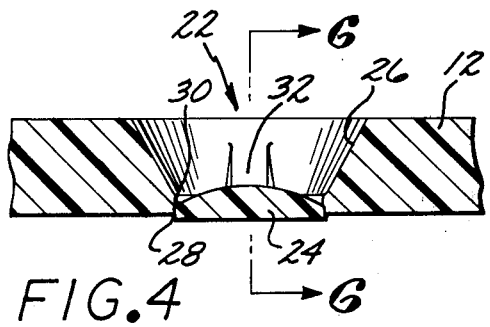
FIG. 4 is a fragmentary sectional view similar to FIG. 3, but showing the reduced thickness section broken away.
Figure 6:
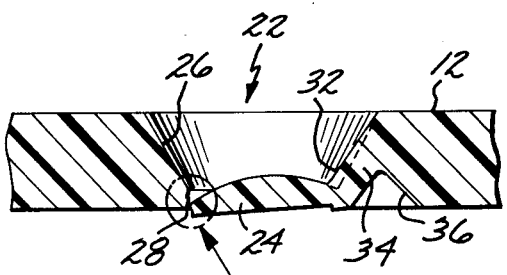
FIG. 6 is a fragmentary sectional view taken substantially along line 6—6 of FIG. 4.

After the relay 10 has been properly secured to the board, and the entire board is to be placed in operation at the job location or the like, the reduced section 24 can be broken away as shown most particularly in FIGS. 4, 6 and 7 of the drawings.

Any pointed instrument can accomplish such break away, merely by pressing such instrument on the section 24. The oppositely disposed continuous corners 28 and 30 provide a weakness whereby the reduced section 24 is pushed inwardly from the case, as shown most particularly in FIG. 4 of the drawings. The retaining member 32, however, is strong enough at the hinge portion 34 so as not to break away from the wall of case 12 thus causing such reduced section 24 to be retained in attached relation to the wall. The net effect, however, is that the hermetically sealed condition of the case 12 has thus been disrupted enabling air to pass through the wall so as to equalize the pressure internally and externally of the case. This affords the "breathing" of the case necessary for maintaining the relay in proper working condition for an extended period of time.

Although I have shown and described certain specific embodiments of my invention, I am well aware that many modifications thereof are possible.

I claim:

1. An electronic instrument case comprising in combination,
    an enclosure having a wall formed of breakable material and adapted to receive an appropriate electronic instrument,
    the wall of said enclosure having a section of reduced thickness formed by a generally tapered continuous surface which provides maximum enclosure wall thickness remotely of said reduced thickness and minimum enclosure wall thickness thereat,
    said tapered surface being formed exteriorly of said enclosure to provide said reduced section at the interior thereof,
    said section including at the interior surface of said enclosure a continuous offset at the reduced thickness,
    and a retaining member of varying thickness attached to both said reduced thickness section and to the remainder of said wall to retain said reduced section attached to said wall after it is manually broken inwardly of said enclosure.

2. An electronic instrument case according to claim 1, wherein the thickness of said retaining member varies from minimum at said reduced thickness section to maximum at said remainder of said wall.

3. An electronic instrument case according to claim 2, wherein said reduced thickness section and said continuous tapered surface meet to form a generally circular breaking line about said reduced thickness section and said retaining member is formed integrally with both said reduced thickness section and said tapered surface.

4. An electronic instrument case according to claim 3, wherein said tapered surface is a generally frusto-conical surface which varies from maximum diameter at said remainder of said wall to minimum diameter at said reduced thickness section.

5. An electronic instrument case according to claim 3, wherein the continuous offset in the interior surface is aligned with said breaking line about said reduced thickness section.

* * * * *